United States Patent [19]

Wishart et al.

[11] Patent Number: 5,293,329
[45] Date of Patent: Mar. 8, 1994

[54] APPARATUS FOR AND METHOD OF DIGITAL SIGNAL PROCESSING

[75] Inventors: Alexander W. Wishart; Francis J. Lake; Paul C. Marston, all of Stevenage, Great Britain

[73] Assignee: British Aerospace Public Limited Company, London, England

[21] Appl. No.: 839,555

[22] Filed: Feb. 24, 1992

[30] Foreign Application Priority Data

Feb. 28, 1991 [GB] United Kingdom ............... 9104186

[51] Int. Cl.⁵ ............................................. G06F 15/31
[52] U.S. Cl. ................................... 364/724.13; 364/724.1
[58] Field of Search ............... 364/724.13, 724.1, 726

[56] References Cited

U.S. PATENT DOCUMENTS

| 4,691,292 | 9/1987 | Rothweiler | 364/724.13 |
| 4,829,378 | 5/1989 | LeGall | 364/724.13 X |
| 4,918,524 | 4/1990 | Ansari et al. | 364/724.1 X |

FOREIGN PATENT DOCUMENTS 2241853 11/1991 United Kingdom .

OTHER PUBLICATIONS

Michael R. Portnoff, "Implementation of the Digital Phase Vocoder Using the Fast Fourier Transform", IEEE Transactions on Acoustics, Speech, and Singal Processing, vol. ASSP-24, No. 3, Jun. 1976, pp. 243-248.

S. Joseph Campanella et al., "A Flexible On-Board Demultiplexer/Demodulator", pp. 299-303, no publication date available.

R. E. Crochiere, "A Weighted Overlap-Add Method of Short-Time Fourier Analysis/Synthesis", IEEE Transactions on Acoustics, Speech, and Singal Processing, vol. ASSP-28, No. 1, Feb. 1980, pp. 99-102.

Primary Examiner—Tan V. Mai
Attorney, Agent, or Firm—Cushman, Darby & Cushman

[57] ABSTRACT

Apparatus for and a method of digital signal processing utilises a technique known as sub-band decomposition and reconstruction. A plurality of input channels are provided each of which is mixed with a vernier frequency correction. In a multiplexer implementation, a fast fourier transform (FET) weighted overlap-add demultiplexer is provided for decomposing each input channel into sub-bands. The sub-band outputs are decimated by a factor to the common input sampling rate of a multiplexer, the sub-bands from each channel then being passed into the appropriate ports of an FFT weighted overlap-add multiplexer by a switch matrix. The multiplexer reconstructs the individual channels, interpolates each channel up to the output sampling rate of the FDM signal, mixes each channel up to its assigned carrier frequency in the frequency division multiplexed (FDM) (FDM) and multiplexes the channels. This provides a computationally efficient architecture with the flexibility to accommodate channels of differing bandwidths.

13 Claims, 3 Drawing Sheets

APPARATUS FOR AND METHOD OF DIGITAL SIGNAL PROCESSING

BACKGROUND OF THE INVENTION

1. Field of the Invention

The present invention relates to apparatus for and a method of digital signal processing.

2. Description of Prior Art

In the specification the following abbreviations are employed:
ASIC: Application Specific Integrated Circuit
DSP: Digital Signal Processing
FDM: Frequency Division Multiplex
FIR: Finite Impulse Response
FFT: Fast Fourier Transform
MCDD Multi-Carrier Demultiplexer/Demodulator
OBP On-Board Processing This invention is in the field of DSP ASIC architectures for frequency multiplexing and demultiplexing of sampled signals. A considerable body of work has already been done on such circuits which form the central component of OBP payloads proposed for a wide variety of near-term satellite communications systems. The aim is to demultiplex or multiplex an FDM of signal channels on-board the satellite for purposes which can include: individual channel power control and/or channel to beam routing and/or subsequent demodulation of the signal channels in an MCDD.

The focus is always on reducing the computational complexity of the architecture, and hence the ASIC mass and power requirements. Many efficient architectures are based on the use of an FFT to simultaneously demultiplex or multiplex a block of signal channels. A good example of the current "state-of-the-art" in such designs is described in the specification of United Kingdom Patent Application No. 9005178 dated 8th March, 1990 in the name of the Applicants.

Existing designs based on block-FFT processing impose the constraint of a uniform channel stacking scheme, that is, the individual channel slots must be equally spaced and contiguous see R. E. Crochiere and L. R. Rabiner, 'Multi-Rate Digital Signal Processing', Prentice-Hall, 1983 . This is because the FFT acts as a uniform filter bank. This constraint can be a disadvantage; many attractive system scenarios require multiplexing/ demultiplexing of channels which have a mix of different bandwidths. For example, it may be desirable to alter the bandwidth spacings of the channels processed in the OBP after the satellite is in operation, in response to a change in traffic demand.

An architecture which aims to offer this flexibility is described in S. J. Campanella and S. Sayegh, 'A Flexible On-Board Demultiplexer/Demodulator', Comsat laboratories, which is based on the well known overlap-save technique for digital FIR filtering using an FFT (see also R. E. Crochiere and L. R. Rabiner, 'Multi-Rate Digital Signal Processing' Prentice-Hall, 1983). This design, however, appears to ignore an essential facet of this technique, namely that the length of the overlap has to be precisely one sample less than the length of the unit sample response of the FIR filter (see R. E. Crochiere and L. R. Rabiner, 'Multi-Rate Digital Signal Processing' Prentice-Hall, 1983). The practical effect of this oversight would be to degrade the performance of the proposed system (in terms of signal quality) by adding a noise-like distortion to the demultiplexed channel. The design could be modified to be mathematically correct but this would seriously compromise its computational efficiency.

SUMMARY OF THE INVENTION

An object of the present invention is to mitigate the above explained problem.

According to one aspect of the present invention there is provided apparatus for digital signal processing for variable bandwidth signals comprising a bank of contiguous digital filters having overlapping frequency responses which together span the bandwidth of the input signal and sum to unit allpass response.

According to another aspect of the present invention there is provided a method of digital signal processing including the steps of feeding an input signal to a bank of contiguous digital filters having overlapping frequency responses which together span the bandwidth of the input signal and subsequently summing individual filter outputs to reconstruct the input signal.

BRIEF DESCRIPTION OF THE DRAWINGS

In order that the invention may be more clearly understood, one embodiment of the invention will now be described, by way of example, with reference to the accompanying drawings, in which:-

DESCRIPTION OF A PREFERRED EXEMPLARY EMBODIMENT

The invention utilises a technique known as sub-band decomposition and reconstruction. This technique is described in A. Papoulis, 'Signal Analysis', McGraw-Hill, 1984; M. R. Portnoff, 'Implementation of the digital phase vocoder using the fast Fourier transform' IEEE Trans. Acoust., Speech, Signal Processing, vol. ASSP-24, pp243–248, June 1976; R. E. Crochiere, 'A Weighted Overlap-Add Method of Short-Time Fourier Analysis/Synthesis', IEEE Trans. Acoust., Speech, Signal Processing, vol. ASSP-28, pp 99–102, February, 1980. In effect this is a computationally efficient implementation of a bank of contiguous digital filters, which have overlapping frequency responses and which together span the bandwidth of the input signal and sum to a unit response. This means that the individual filter outputs, or sub-bands, can be subsequently summed to reconstruct the input signal. If the sub-band signals are decimated (downsampled) then it is necessary to interpolate them prior to reconstruction, which functions are efficiently combined in an FFT multiplexer (see M. R. Portnoff, 'Implementation of the digital phase vocoder using the fast Fourier transform' IEEE Trans. Acoust., Speech, Signal Processing, vol. ASSP-24, pp243–248, June 1976, R. E. Crochiere, 'A Weighted Overlap-Add Method of Short-Time Fourier Analysis/Synthesis', IEEE Trans. Acoust., Speech, Signal Processing, vol. ASSP-28, pp 99–102, February, 1980).

Figure 1:
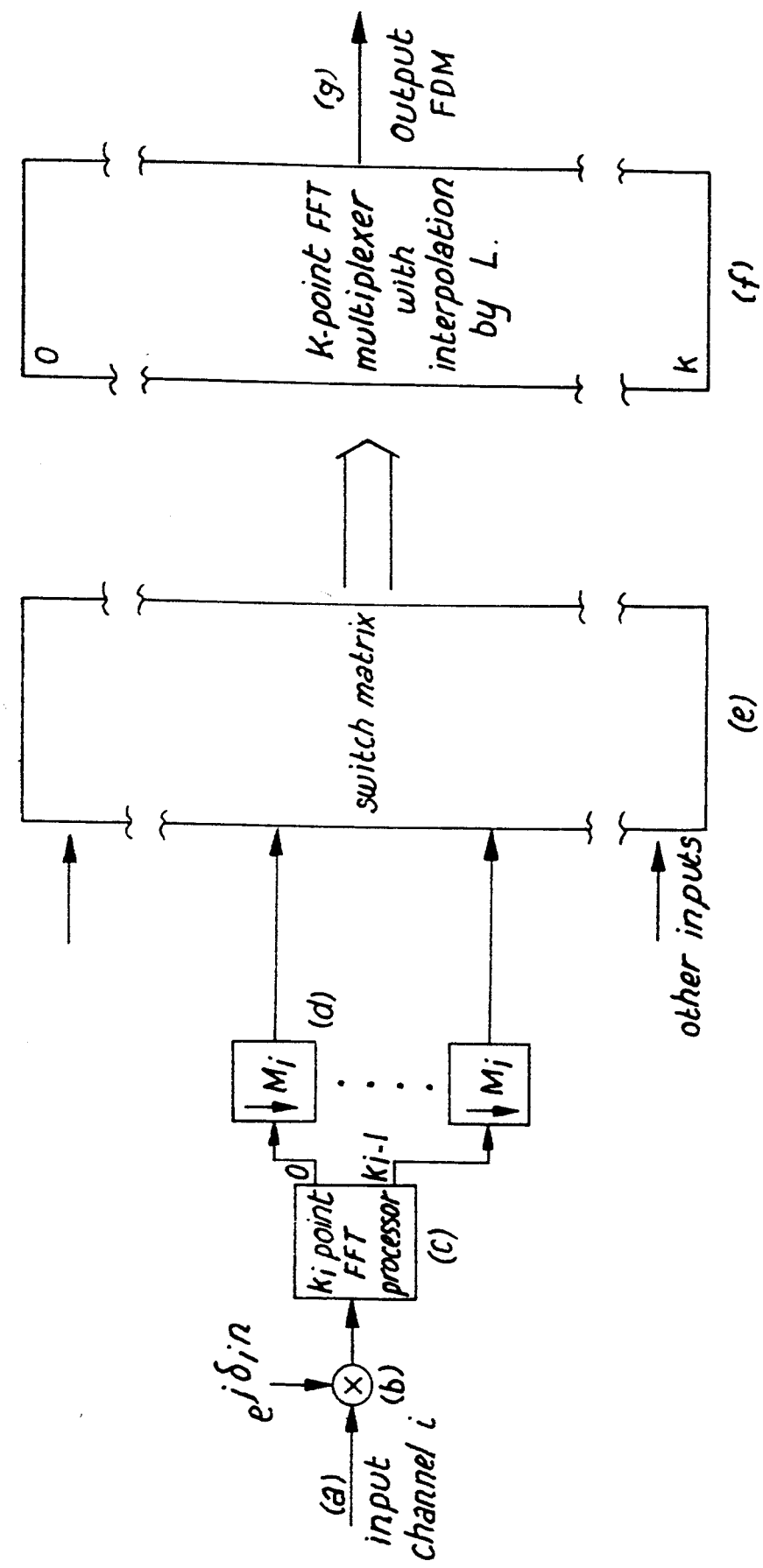
FIG. 1 shows a block FFT multiplexer for variable bandwidth inputs.

The multiplexer aspect of the present invention is shown in FIG. 1. The processing stages are as shown, namely:

1. each baseband video signal input channel (a) is mixed with a vernier frequency correction (b)

2. each input channel is decomposed into sub-bands using an FFT weighted overlap-add demultiplexer (c), with a suitable filter design 3. for each channel, the sub-band outputs are decimated (d) to the common input sampling rate of the multiplexer
4. the sub-bands from each channel are now passed into the appropriate ports of an FFT weighted overlap-add multiplexer (f) by means of a switch matrix (e); the processor (f) performs the function of reconstructing the individual channels interpolating each channel up to the output sampling rate B of the FDM signal mixing each channel up to its assigned carrier frequency in the FDM multiplexing the channels The block-FFT multiplexer (f) features a K-point complex-complex FFT transform and interpolation by a factor L. The multiplexer output (g) is a complex baseband video signal comprising the FDM. The individual input channels (a) are bandlimited complex baseband video signals. An input channel i is divided into $K_i$ sub-bands using a $K_i$-point FFT demultiplexer (c); each sub-band output from the channel i demultiplexer is decimated by a factor $M_i$ (d). Frequencies w (in radians/sample) in the input channel are therefore mapped to multiplexer output frequencies w' by the relation:

$$w - > w' = w M_i / L \quad (1)$$

The sub-bands corresponding to channel i are spaced by $\Delta w = 2\pi/K_i$. Proper reconstruction of a channel i in the output multiplex requires that:

$$\Delta w - > \Delta w' = > (2\pi/K_i)(M_i/L) = 2\pi/K = > K-/K_i = L/M_i > 1 \quad (2)$$

Figure 2A:
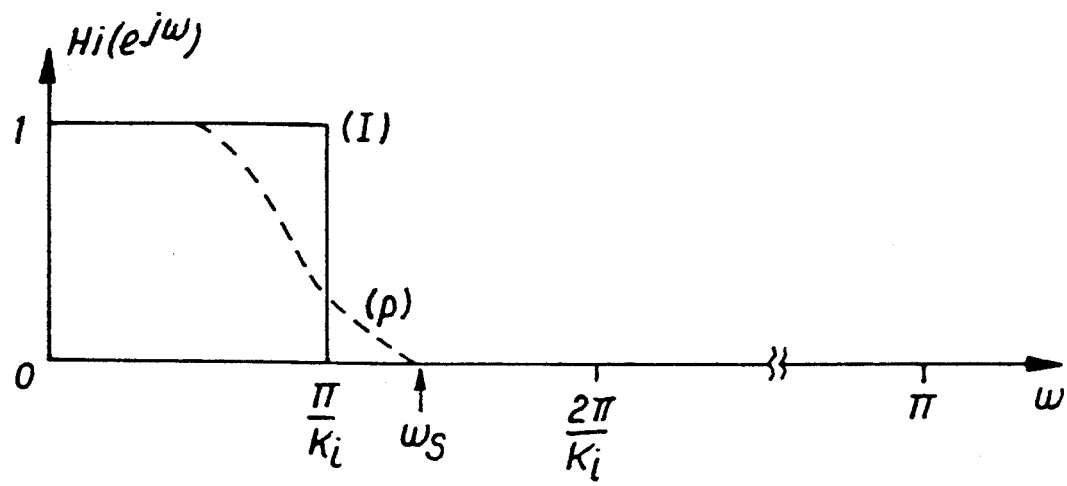
FIGS. 2a to 2d show the frequency response of filters for the multiplexer of FIG. 1.

FIG. 2a shows the prototype frequency response of the filter $H_i(e^{jw})$ associated with sub-band decomposition of the channel i using a $K_i$-point FFT. The ideal response (I) is a 'brick-wall' filter; the practical response (P) is relaxed, with stopband $w_s$ less than $2\pi/K_i$ as shown. Note that this implies that the decimation faction $M_i$ associated with the sub-bands of channel i must be less than $K_i$.

Figure 2B:
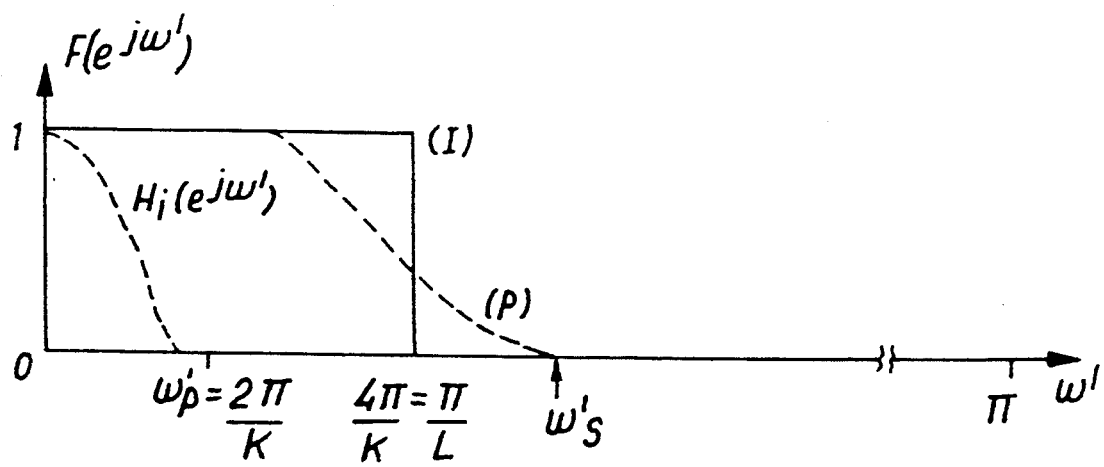

FIG. 2b shows the prototype frequency response of the common filter $F(e^{jw'})$ associated with the subsequent reconstruction of the channel sub-bands and interpolation up to the FDM output frequency in the multiplexer; the response shown is for the particular case of interpolation factor L=K/4 (practical filter designs require that L < K). The ideal anti-image (interpolation) filter (I) associated with the FFT multiplexer would be 'brick-wall' filter with passband edge at $w' = \pi/L = 4\pi/K$. In practice this must be relaxed as shown, with the passband edge of the interpolating filter (P) at $w'_p = 2\pi/K$ greater than or equal to the stopband edge of the sub-band decomposition filter. The frequency response of the filter $H_i(e^{jw})$ is shown in FIG. 2b as it maps onto the output frequency axis w' according to the relations (1) and (2) above.

Note that:

$$|F(e^{jw'})| = 1 \text{ for } 0 \leq |w'| \leq 2\pi/K \quad (3)$$

This, combined with the use of a standard windowed FIR design for the sub-band decomposition filters $H_i$, which preserves the zero-crossings of a rectangular window in the unit sample response, satisfies the requirements for correct reconstruction, see M. R. Portnoff, 'Implementation of the digital phase vocoder using the fast Fourier transform' IEEE Trans. Acoust., Speech, Signal Processing, vol. ASSP-24, pp243-248, June 1976.

The input channel i is mixed to a centre frequency:

$$w'\delta_i + 2\pi k/K \quad (4)$$

where k is an integer 0, ...,K-1 and $\delta_i$ a vernier frequency offset supplied by the channel mixer (b) in FIG. 1, where:

$$|\delta_i| \leq \pi/K \quad (5)$$

In the example being discussed the interpolation factor in the multiplexer is L = K/4 and so the sub-bands input to the FFT multiplexer must be at a sampling rate of $2\pi/L = 8\pi/K$.

Figure 2C:
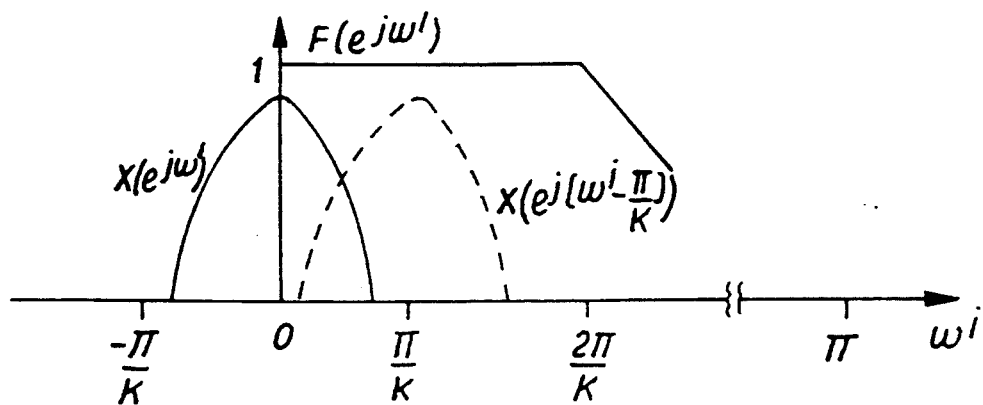

It can be seen from FIG. 2c that an input channel i, which is bandlimited to less than $\Delta w' = 2\pi/K$ (and hence is oversampled by at least a factor of 4,), does not require sub-band decomposition. The spectrum of channel i is denoted as $X(e^{jw'})$. Even with the maximum vernier shift of $|\delta_i| = \pi/K$ the shifted spectrum $X(e^{j(w' - \pi/K)})$ of channel i still lies entirely within the passband of the anti-image filter F. Such channels can therefore be directly entered into the switch matrix bypassing processing blocks (c) and (d) of FIG. 1.

Figure 2D:
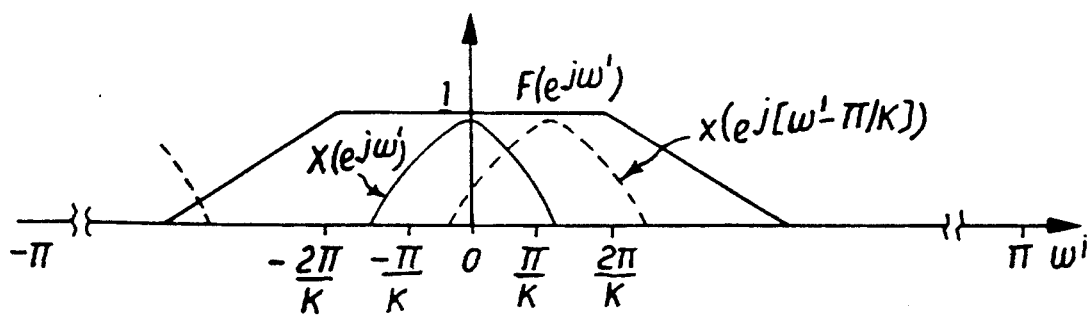

FIG. 2d shows the case where an input channel i has a bandwidth $> \Delta w'$ and is subjected to a vernier shift of $\pi/K$. The channel must be decomposed into sub-bands to avoid distortion in the transition band of the anti-image filter F and leakage from the images at $w' = -2\pi/L$.

This system can be designed to accommodate a particular mix of input channel bandwidths; with appropriate mixing and switching of the sub-band groups to the input ports of the multiplexer these input channels can be multiplexed to different bands of the output FDM. With programmable FFT processors (c) on each input line this system offers the flexibility to be reconfigured at a later date to accommodate a different mix of bandwidths in the input channels.

The demultiplexer is simply the multiplexer run in reverse.

The above described embodiment provides a mathematically exact and computationally efficient architecture with the flexibility to accommodate channels of differing bandwidths. In particular the performance of the multiplexer/demultiplexer in terms of its impact on signal quality can be quantified exactly given the design specifications on the filters used.

It will be appreciated that the above embodiment has been described by way of example only and that many variations are possible without departing from the scope of the invention.

We claim:

1. An apparatus for digital signal processing of a plurality of variable bandwidth input signals comprising:

a plurality of signal input channels, each said input channel having a vernier frequency correction element, a first of said plurality of input signals input into a first of said plurality of input channels;

a bank of contiguous digital filters having overlapping frequency responses that together span the bandwidth of said first input signal, said bank of digital filters combine to decimate said plurality of input signals.

2. Apparatus for digital signal processing as claimed in claim 1, wherein said bank of contiguous digital filters comprise an FFT weighted overlap-add demultiplexer, said FFT demultiplexer being connected to said first input channel and receives said first input signal, said FFT demultiplexer decomposes said first input signal into subbands.

3. Apparatus for digital signal processing as claimed in claim 2, wherein said bank of contiguous digital filters further comprise, for each channel, a decimating means for decimating said sub-bands by a factor common to an input sampling rate.

4. Apparatus for digital signal processing as claimed in claim 3, further comprising:
  a switch matrix; and
  an FFT overlap-add multiplexer, said switch matrix operatively passing said sub-bands to appropriate input ports of said FFT multiplexer.

5. Apparatus for digital signal processing as claimed in claim 4, wherein the FFT weighted overlap-add multiplexer reconstructs said first input signal and comprises an interpolation means for interpolating said first input signal to a predetermined output sampling rate, said FFT multiplexer mixes said first input signal with a predetermined carrier frequency and outputs a first output signal.

6. Apparatus for digital signal processing as claimed in claim 1, wherein said plurality of input signals are each in complex baseband video form.

7. A method of digital signal processing including the steps of:
  feeding a first input signal into a first input channel;
  mixing said first input signal with a vernier frequency, said vernier frequency used as a correction frequency;
  inputting said first input channel into a bank of contiguous digital filters, said digital filters having an overlapping frequency response that together span the bandwidth of said first input signal;
  decomposing said first input signal into subbands;
  summing said sub-bands to produce a reconstructed first input signal.

8. A method of digital signal processing as claimed in claim 7, further comprising a step of interpolating, prior to the step of summing, wherein said sub-bands are interpolated up to a predetermined output sampling rate.

9. A method of digital signal processing as claimed in claim 7, wherein said feeding step further comprises feeding a plurality of input signals into a band of contiguous digital filters.

10. A method of digital processing as claimed in claim 7, wherein said decomposing step is achieved by using an FFT weighted overlap-add demultiplexer.

11. A method of digital signal processing as claimed in claim 10, further comprising the step of decimating, after the step of decomposing, wherein said sub-bands are decimated by a factor common to the input sampling rate of an FFT multiplexer.

12. A method of digital signal processing as claimed in claim 11, further comprising, after said step of decimating, the steps of:
  passing said sub-bands, each to an appropriate input part of an FFT weighted overlap-add multiplexer using a switch matrix, and
  wherein said summing step comprises the steps of:
  multiplexing said sub-bands in order to reconstruct said first input signal;
  interpolating said reconstructed first input signal up to an output sampling rate of an FDM signal; and
  combining said reconstructed first input signal with a predetermined carrier frequency.

13. A method of digital signal processing comprising the steps of:
  feeding a plurality of input signals into a bank of contiguous digital filters, each said input signal input into a predetermined input channel;
  mixing into each said input channel a vernier frequency, said vernier frequency providing correction to said input channel;
  decomposing each said input channel into subbands using an FFT weighted overlap-add demultiplexer;
  decimating said sub-bands by a factor common to a predetermined sampling rate;
  passing said decimated sub-bands each to an appropriate input port of an FFT weighted overlap-add multiplexer, said passing is performed by a switch matrix;
  multiplexing said decimated sub-bands in said FFT multiplexer in order to produce recreated input signals;
  interpolating each said recreated input signal up to a predetermined output sampling rate;
  combining each said recreated input signal with a predetermined carrier frequency; and
  frequency division multiplexing said recreated input signals to create an output signal.

* * * * *